(12) United States Patent
Duncan et al.

(10) Patent No.: US 8,748,212 B2
(45) Date of Patent: Jun. 10, 2014

(54) METHOD AND DEVICE FOR PRODUCING SOLAR CELL STRINGS

(75) Inventors: William D. Duncan, Elisabethtown, PA (US); Adrian H. Gretler, Dallastown, PA (US); James R. Lyon, Etters, PA (US); Brad M. Dingle, Red Lion, PA (US)

(73) Assignee: Komax Holding AG, Dierikon (CH)

( * ) Notice: Subject to any disclaimer, the term of this patent is extended or adjusted under 35 U.S.C. 154(b) by 92 days.

(21) Appl. No.: 13/600,566

(22) Filed: Aug. 31, 2012

(65) Prior Publication Data

US 2014/0065747 A1    Mar. 6, 2014

(51) Int. Cl.
*H01L 21/00* (2006.01)

(52) U.S. Cl.
USPC ............................................. 438/61; 438/62

(58) Field of Classification Search
CPC ........................ H01L 31/0504; H01L 31/188
USPC ...................................................... 438/61–62
See application file for complete search history.

(56) References Cited

U.S. PATENT DOCUMENTS

2012/0042925 A1\*   2/2012   Pfennig .................... 136/244

\* cited by examiner

*Primary Examiner* — Richard Booth
(74) *Attorney, Agent, or Firm* — Fraser Clemens Martin & Miller LLC; William J. Clemens

(57) ABSTRACT

A method and an apparatus for producing solar cell strings by connecting at least two solar cells by a least one conductor ribbon of a first length, wherein the solar cells are respectively spaced from one another at a string cell spacing(s), until a desired number of solar cells for producing a first solar cell string is connected together, connecting a further solar cell with a last solar cell of the first solar string by at least another conductor ribbon which is longer than the at least one conductor ribbon, wherein the second solar cell is spaced from the last solar cell at a greater spacing than the string cell spacing(s) and wherein the second solar cell forms the first solar cell for a second solar string, and separating the at least another conductor ribbon for decoupling the first solar cell string.

8 Claims, 3 Drawing Sheets

METHOD AND DEVICE FOR PRODUCING SOLAR CELL STRINGS

FIELD OF THE INVENTION

The present invention relates to a method and device for producing solar cell strings. Solar cell strings of that kind consist of solar cells which are arranged in a row and are or are to be connected together by electrical conductors (for example, conductor ribbons).

BACKGROUND

Solar cells have to electrically connected together in order to produce crystalline photovoltaic modules. In the process known as strand formation (stringing) solar cells are arranged in a row by means of, for example, a pick-and-place device and the solar cells are electrically connected together, whereby "strands" of solar cells are formed. Electrically conductive conductor ribbons are frequently used as the conductor. These can be thin, flat strips of copper. The rear side of a solar cell is electrically connected with the front side of the next or succeeding solar cell by electrical contacting by means of the mentioned conductor ribbons. The respective electrical contacts are finally completed in a soldering process or other connecting method. Methods and devices for producing solar cell strings have become known from, for example, US 2010/7038358, US 2006/219352 and U.S. Pat. No. 6,410,940.

FIG. 1 shows, in a schematic illustration, the individual steps of a method of producing solar cell strings as currently known and conventional. A start conductor length 4 is initially provided (step S1), upon which a first solar cell 1 is placed (step S2). Conductor ribbons for connecting adjacent solar cells are now used. These conductor ribbons are denoted by "5" in FIG. 1 (as well as in the succeeding FIG. 2). Such a conductor ribbon is deposited on the first solar cell 1 in a third working step S3. A second solar cell 1' is thereafter placed on the rear part of the conductor ribbon 5 (step S4). As apparent, this conductor ribbon connects a front side of the first solar cell 1 with the rear side of the second solar cell 1'. Simultaneously with the placing of the second solar cell 1' the first solar cell 1 is electrically connected with the start conductor length 4 in a soldering or other method with use of a contacting device. The thus-produced structure is then displaced by one position by a position matched to the solar cell with use of conveying means, which is not illustrated (step S5). A second conductor ribbon 5 can then be deposited on the second solar cell 1' (S6) and then a third solar cell 1" is placed on the second conductor ribbon 5 (step S7). After the structure now comprising three solar cells has been displaced by one further position (step S8), an end conductor ribbon 6 is placed on the third solar cell 1" (step S9) and connected therewith by soldering (step S10). A first solar cell string is now finished. In order for a next solar cell string to be able to be produced the solar cell string is displaced by a few positions (step S11). Thereafter, a second solar cell string can be produced in accordance with the described method sequence. The steps S12 to S21 necessary for that purpose substantially correspond with the afore-described steps S1 to S10. For better understanding and for differentiation, the solar cells of the second solar cell string are denoted by 2, 2' and 2".

It is an object of the invention to create a method and a device for producing solar cell strings, by which solar cell strings can be produced simply and in a more efficient mode and manner.

SUMMARY OF THE INVENTION

The method of producing solar cell strings, which consist of solar cells arranged in a row and are or are to be connected together by electrically conductive conductor ribbons of a first length, substantially comprises the following method steps: At least two solar cells are connected together by at least one conductor ribbon of the first length. The connection of the solar cells is, in that case, carried out in such a manner that the conductor ribbons each connect a sun side or front side of a solar cell with a rear side of an adjacent solar cell. The solar cells are in that case spaced from one another at a respective string cell spacing. This first method step is carried out until solar cells of a desired number for producing a first solar cell string are electrically connected together. In a next method step a further solar cell is connected with a last solar cell of the first solar cell string by at least one conductor ribbon, which is preferably lengthened by comparison with the mentioned conductor ribbon with the first length, wherein the further solar cell is spaced from the last solar cell at a spacing greater than the string cell spacing and wherein the said further solar cell forms the first solar cell for a second solar cell string. The lengthened conductor ribbon thus to a certain extent represents a form of intermediate conductor ribbon. Thereafter, the afore-mentioned first method step can be repeated at least in part. In this regard it is to be noted that it is no longer necessary for all solar cells to be joined until reaching the desired number of solar cells for the second and further strings. The method comprises as a further method step the separation of the lengthened conductor ribbon for decoupling the first solar cell string.

Due to the fact that the last solar cell of the first solar cell string is connected by at least one conductor ribbon which is preferably lengthened by comparison with the conductor ribbons of the first solar cell string it is possible for solar cell strings to be produced in a continuous process. With the exception of the very first string and the last string produced in the entire process the application of special start conductor lengths and end conductor lengths to the solar cell strings is eliminated, whereby the method sequence is optimised and output can be substantially increased. Other than the first and last solar cell strings it is thus possible to produce a plurality of strings in an entire process with merely two different conductor ribbon kinds. The degree of automation can be further substantially increased by this method.

If the solar cells are each preshaped or are shaped in such a way during the connecting process of two solar cells that a step for bridging over the difference in level for connecting a sun side of a solar cell with a rear side of an adjacent solar cell arises it can be advantageous if on separation of the lengthened conductor ribbon an intermediate length with the mentioned step is cut out. The lengthened conductor ribbon is preferably separated in such a manner that the mutually opposite residual conductor ribbon sections remaining after separation of the lengthened conductor ribbon correspond with respect to length dimension to a start or end conductor length of a solar cell string. It can thus be possible to dispense with subsequent processing of a solar cell string produced in that way. The separation of the lengthened conductor ribbon can be undertaken by a punching process. This can be achieved by simple technical means.

In a preferred form of embodiment the separation of the lengthened conductor ribbon can be carried out only after connection of a second solar cell with the further solar cell for the second solar cell string. A process sequence which is more reliable and less liable to disturbance can be guaranteed in this way. The separation can take place directly after mounting this second solar cell or after mounting a third solar cell or further solar cells. In theory it would even be conceivable to initially produce a super string with a plurality of solar cell strings connected together by lengthened conductor ribbons and only thereafter to perform the separating processes (depending on the respective number of lengthened conductor ribbons).

It can be particularly advantageous if after separation of the at least one lengthened conductor ribbon at least one solar cell is, for formation of the second solar cell string, respectively attached by means of at least one conductor ribbon of the first length and at the string cell spacing to the already-constructed structure having the conductor ribbons and solar cell.

In terms of method it can then be advantageous if the separation of the lengthened conductor ribbon takes place simultaneously with the deposit of a conductor ribbon of the first length on a solar cell for the second solar cell string.

It is particularly preferred if a plurality of solar cell strings is produced in a continuous process, in which case, apart from the first solar cell string and a last solar cell string of the entire production process, conductor ribbons with two different lengths (i.e. conductor ribbons with a first length matched to the desired cell spacing on the one hand and lengthened conductor ribbons of the described kind on the other hand) are used.

A further aspect of the invention relates to a device for producing solar cell strings by which the afore-described method can be carried out. The device comprises a module for connecting two solar cells by at least one conductor ribbon. The module comprises a conveying device for conveying solar cells, a depositing device for depositing solar cells on the conveying device, a positioning device for positioning a front region of at least one conductor ribbon on a solar cell deposited on the conveying device, wherein conductor ribbons of different length can be deposited by the depositing device, and a separating station for separating the at least one conductor ribbon between two interconnected solar cells conveyed by means of the conveying device.

The separating station can be so designed that when a conductor ribbon is separated an excess conductor ribbon length is removable. In that case, the lengthened conductor ribbon, which was mentioned in the introduction and which connects the last solar cell of a solar cell string with a first solar cell of a succeeding solar cell string, is preferably separated.

The separating station can comprise two cutting or shearing elements arranged adjacent to one another with respect to the conveying direction or to the longitudinal direction predetermined by the arranging of the solar cells in a row. The cutting or shearing elements can be mounted to be fixed or to be movable in the direction of the conveying device for execution of a cutting or punching procedure.

The connecting module can additionally comprise a contacting device for producing an electrical contact between solar cell and conductor ribbon, in which case the contacting device can be constructed as a soldering, welding, gluing or taping device.

BRIEF DESCRIPTION OF THE DRAWINGS

For a better understanding of the invention described herein and to show more clearly how it may be carried into effect, reference will now be made, by way of example only, to the accompanying drawings, which show exemplifying embodiments and in which.

DETAILED DESCRIPTION OF THE PREFERRED EMBODIMENT

Figure 1:
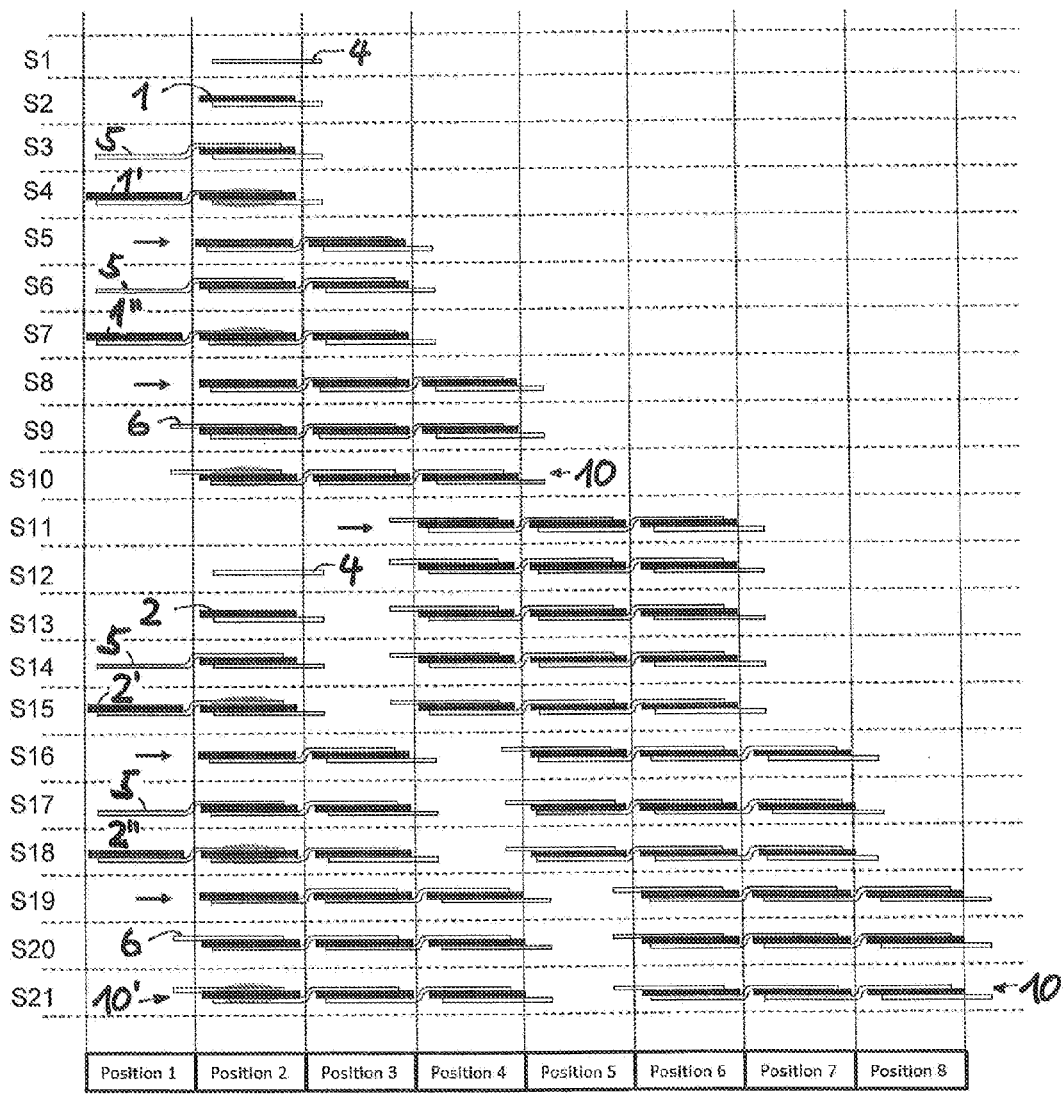
FIG. 1 is a schematic illustration of a method of producing a solar cell string according to the prior art.
Figure 2:
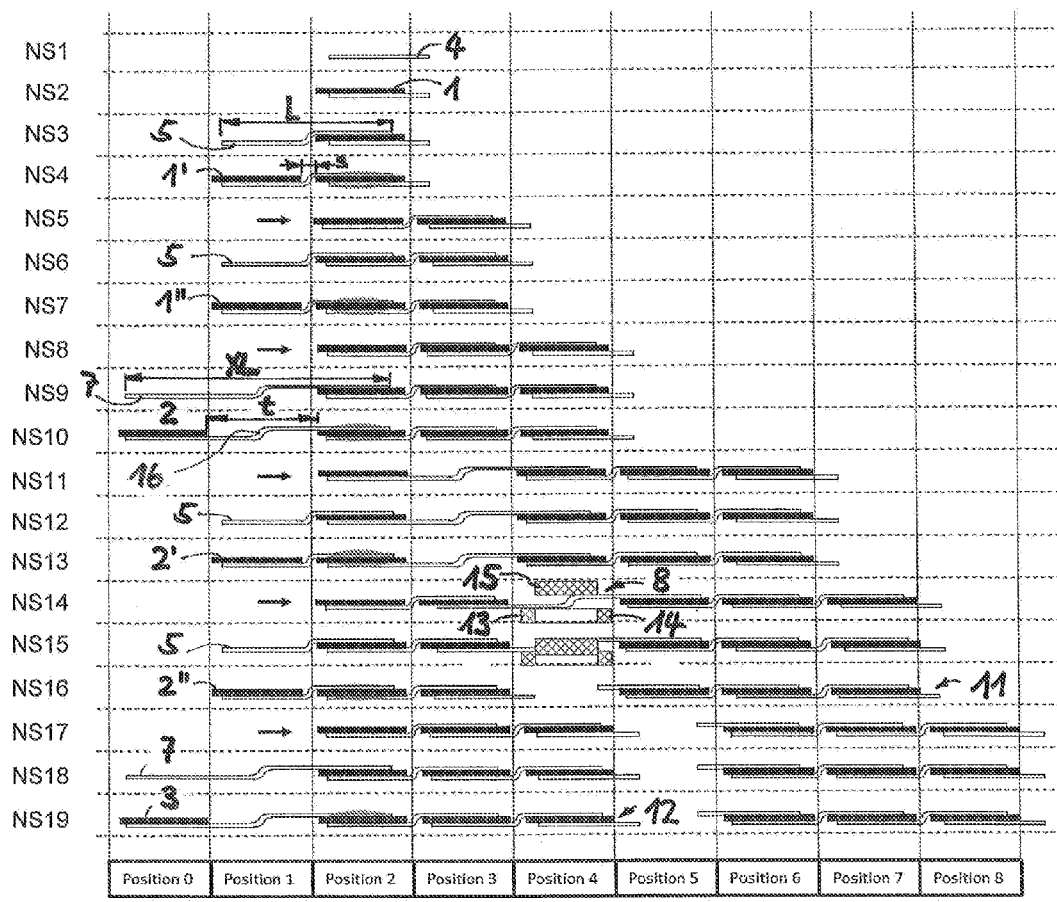
FIG. 2 is the method according to the invention.

FIG. 2 shows the method according to the invention for producing solar cell strings, divided up into individual method steps. The method is distinguished by the fact that two or more solar cells 1, 1', 1" are connected together by conductor ribbons 5 of a first length L. The length L is in that case dependent on the desired string cell spacing s of adjacent cells of a string. This spacing is also termed string cell spacing in the following. Instead of producing the solar cell string by provision of a start conductor length as a starting point for construction of the string and mounting an end conductor length on a last solar cell of a structure as in the case of the known method illustrated in FIG. 1 a conductor ribbon 7 lengthened by comparison with the conductor ribbon 5 is mounted on the last solar cell 1" of the first solar cell string 11 and the string construction continued by at least one further solar cell. The respective solar cell string arises through separation of the lengthened conductor ribbons 7. It can be seen from FIG. 2 that the first solar cell string 11 is decoupled by separating the conductor ribbon 7 connecting the solar cells 1" and 2 and in this way the production of the first solar cell string 11 is at least provisionally concluded.

The exact method sequence is as follows: Initially, a first solar cell string is partly constructed in accordance with the method known per se. The method steps denoted in FIG. 2 by NS1 to NS8 are, as evident, substantially identical with those of FIG. 1 (there steps S1 to S8). By contrast to the known method, in which an end conductor ribbon is attached to the last solar cell, in the method presented here a further conductor ribbon 7 is attached to the solar cell denoted by 2". With respect to shape the conductor element 7 is formed to be identical with the previously used conductor elements 7 and similarly has a step 16. However, the conductor element 7 is significantly lengthened by comparison with the conductor elements 5. The length of the lengthened conductor element is denoted by XL and the excess length (XL-L) can be, for example, 1 centimeter or more. Thereafter, in a next working step NS10 a further solar cell 2 is placed on the conductor element 7. As apparent from FIG. 2, the cell spacing t between the cells 2 and 2" is significantly larger than the string cell spacing s between the cells 1 and 1' or 1 and 1". A further solar cell 2' is then attached by means of the conductor ribbon 5 in a mode and manner known per se. A conductor element 5 is thus deposited on the solar cell 2 (NS12) and a solar cell 2' placed thereon (step NS13). The steps NS12 and NS13 substantially correspond, as is apparent, with the steps NS2 and NS3 or S2 and S3. After the thus-created structure has been displaced by one position, the lengthened conductor ribbon 7 is severed with the help of a separating station denoted by 8. During the separating process, which is illustrated in steps NS14 and NS15, an intermediate length is cut out. After the separating process the first solar cell string 11 as such is finished. In step NS16 a third solar cell 2" is deposited on a second conductor element 5 and thereafter displaced by one position (NS17). The working steps NS16 and NS17 substantially correspond with the steps NS7 and NS8. Thereafter, for construction of the third and further strings the respective steps are repeated. For construction of the third solar cell string a lengthened conductor ribbon 7 is attached to the last solar cell 2" (NS18). The solar cells 2, 2' and 2" finally yield a second solar cell string 12, which is finished in step NS19 (but before the separating procedure). The solar cell 2" forms the last solar cell of a second solar cell string, which is indicated by 12. The steps NS9 to NS16 can now be repeated. A solar cell, which is denoted by "3" and which forms a first solar cell of a third solar cell string, is placed on the lengthened conductor ribbon 7 in step NS19. The further steps for construction of the third and further strings are evident from the foregoing description. Towards the end of the process an end conductor ribbon (not illustrated) can finally be mounted on the last solar cell of the last string.

The currently produced solar cell strings consist, by way of example, of three solar cells. The number of solar cells per string can obviously be varied depending on the respective fields of use and application. For the sake of simplicity, only one conductor ribbon, which respectively connects together two adjacent solar cells, was mentioned and illustrated in the description of the method. However, adjacent solar cells are usually electrically connected together by two, three or, depending on the respective cell size, even more conductor ribbons, which preferably run parallel to one another in the longitudinal direction predetermined by the row arrangement. Thus, a group of conductor ribbons can also be understood by the term "conductor ribbon" used in the description.

Conductor ribbons for current solar cells are between 0.01 millimeters and 1 millimeter thick and 0.5 millimeters to approximately 50 millimeters wide. The conductor ribbons consist of copper strips which are usually plated (coated with solder) or, in individual cases, silvered. Not only the conductor ribbons 5, but also the lengthened conductor ribbons 7 have a step 16 for bridging over the level difference for connecting a sun side of a solar cell with a rear side of an adjacent solar cell. This step can arise, due to the flexibility of the thin conductor strip, through bridging over the difference in level for connecting a sun side of a solar cell with a rear side of an adjacent solar cell. The step can be a more or less continuous transition depending on the respective solar cell thickness and cell spacing. However, it would obviously also be conceivable to preshape the conductor ribbons and provide them with a step 16 before the placing. On separation of the lengthened conductor ribbon 7 an intermediate length with a step 16 is cut out (see steps NS14 and NS15). The mutually opposite residual conductor ribbon lengths 24, 25 remaining after separation of the lengthened conductor ribbon 7 correspond, with respect to length dimension, with a start length or section or end conductor length of a solar cell string (cf. FIG. 1), wherein the start lengths and end conductor lengths were denoted by 4 and 5). The separation of the lengthened conductor ribbon 7 is carried out, for example, by a punching process by means of a separating station 8. The separation station 8 comprises two cutting or shearing elements 13 and 14, which are arranged adjacent to one another with respect to the conveying direction, and a punching body 15 movable through between the cutting or shearing elements 13, 14.

Figure 3:
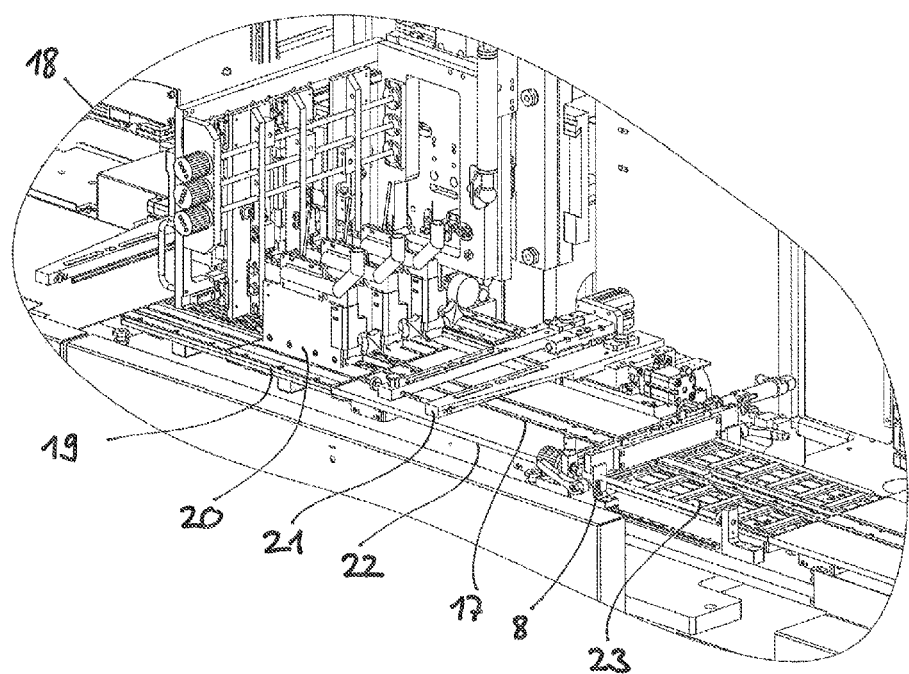
FIG. 3 is a perspective illustration of a module for connecting solar cells for production of solar cell strings and FIG. 4 is a separating station of the invention (detail of FIG. 3).

FIG. 3 shows a device for producing solar cell strings. The device comprises a conveying device 17, which is designed as a walking beam, for conveying solar cells arranged in a row. The conveying direction is indicated by an arrow f. The solar cells are placed on the conveying device in a first station with the help of a depositing device 18. The solar cells can be preheated and activated in the same station. The solar cells are heated up in a contacting device 19 and connected with the conductor ribbons by soldering. For that purpose the contacting device 19 comprises, for example, three soldering heads. In the present exemplifying embodiment the solar cells are respectively connected with the adjacent solar cells by way of three conductor ribbons. Consequently, the device comprises three respective units. The device can obviously also be adapted to other specifications. The mentioned three conductor ribbons are placed individually or together by a positioning device 21 on the conveying device 17 conveying the solar cells. A post-heating zone, in which stresses caused by the soldering process are relieved, is denoted by 22. The solar cells arranged in a row and connected together by conductor ribbons can be separated from one another in the separating station 8. The solar cells are similarly heated when transiting the separating station. A corresponding post-heating zone is denoted by 23.

Figure 4:
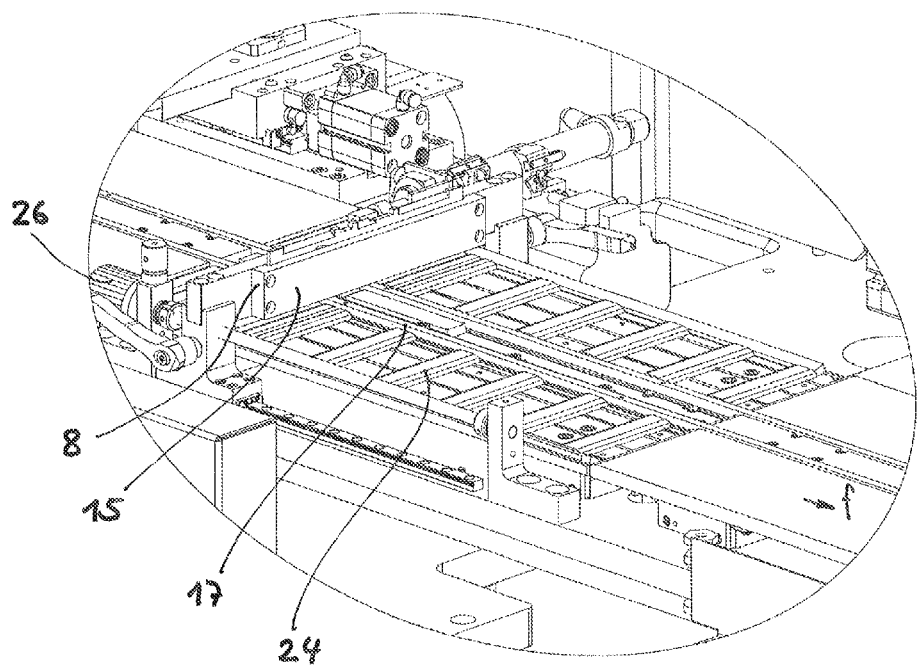

Further constructional details, particularly of the separating station 8, of the device can be seen in FIG. 4. The separating station comprises an upwardly and downwardly movable punching body 15. The separating station 8 can be acted on by way of a setting mechanism 26 with a setting wheels 26 for adaptation to different solar cell sizes, cell spacings, conductor ribbons and/or conductor ribbon intermediate lengths to be cut off. The punching body 15 is, for example, pneumatically drivable. However, other drive means are obviously also conceivable. The post-heating zone 23 comprises heating bodies 24, which are arranged in succession, for heating the solar cells.

What is claimed is:

1. A method of producing solar cell strings, comprising the following steps:
   connecting at least two solar cells by at least one conductor ribbon of a first length, wherein the solar cells are respectively spaced from one another at a string cell spacing, until a desired number of solar cells for producing a first solar cell string is connected together;
   connecting a further solar cell with a last solar cell of the first solar cell string by at least one conductor ribbon of a second length which is longer than the first length, wherein the further solar cell is spaced from the last solar cell at a greater spacing than the string cell spacing and wherein the further solar cell forms a first solar cell for a second solar cell string; and
   separating the at least one second length conductor ribbon to decouple the first solar cell string from the further solar cell.

2. The method according to claim 1 including separating the at least one second length conductor ribbon by cutting out an intermediate length thereof.

3. The method according to claim 1 including separating the at least one second length conductor ribbon to form mutually opposite residual conductor ribbon sections thereon each of the sections corresponding in length to one of a predetermined start conductor length and a predetermined an end conductor length of the solar cell strings.

4. The method according to claim 1 including performing the separation of the at least one second length conductor ribbon by a punching process.

5. The method according to claim 1 including performing the separation of the at least one second length conductor ribbon only after connection of another last solar cell with the further solar cell to form the second solar cell string.

6. The method according to claim 1 including after the separation of the at least one second length conductor ribbon, attaching at least another solar cell to the further solar cell by at least another conductor ribbon of the first length and at the string cell spacing for formation of the second solar cell string.

7. The method according to claim 1 including performing the separation of the at least one second length conductor ribbon simultaneously with deposit of another conductor ribbon of the first length on a solar cell of the second solar cell string.

8. The method according to claim 1 including producing a plurality of solar cell strings in a continuous process, wherein apart from the first solar cell string and a last solar cell string of the process conductor ribbons of the first and second lengths are used.

\* \* \* \* \*